(12) United States Patent
Pellizzer et al.

(10) Patent No.: US 8,785,314 B2
(45) Date of Patent: Jul. 22, 2014

(54) ETCH BIAS HOMOGENIZATION

(75) Inventors: Fabio Pellizzer, Cornate d' Adda (IT); Hernan A. Castro, Shingle Springs, CA (US); Eddie T. Flores, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 13/463,245

(22) Filed: May 3, 2012

(65) Prior Publication Data

US 2013/0292633 A1  Nov. 7, 2013

(51) Int. Cl.
*H01L 21/44* (2006.01)
*H01L 21/3213* (2006.01)
*H01L 21/768* (2006.01)

(52) U.S. Cl.
CPC .... *H01L 21/32134* (2013.01); *H01L 21/76838* (2013.01)
USPC ........... 438/597; 438/584; 438/618; 438/622; 438/104

(58) Field of Classification Search
USPC .......................... 438/104, 584, 597, 618, 622
See application file for complete search history.

(56) References Cited

U.S. PATENT DOCUMENTS

| 7,405,960 | B2 | 7/2008 | Cho et al. |
| 2006/0151771 | A1* | 7/2006 | Asano et al. ...................... 257/2 |
| 2010/0259970 | A1 | 10/2010 | Toda |
| 2010/0259975 | A1 | 10/2010 | Toda |
| 2011/0089507 | A1 | 4/2011 | Mao |

* cited by examiner

*Primary Examiner* — Charles Garber
*Assistant Examiner* — Brigitte Paterson
(74) *Attorney, Agent, or Firm* — Brooks, Cameron & Huebsch, PLLC

(57) ABSTRACT

Methods and memory devices formed using etch bias homogenization are provided. One example method of forming a memory device using etch bias homogenization includes forming conductive material at respective levels over a substrate. Each respective level of conductive material is electrically coupled to corresponding circuitry on the substrate during patterning of the respective level of conductive material so that each respective level of conductive material has a homogenized etch bias during patterning thereof. Each respective level of conductive material electrically coupled to corresponding circuitry on the substrate is patterned.

31 Claims, 5 Drawing Sheets

ETCH BIAS HOMOGENIZATION

TECHNICAL FIELD

The present disclosure relates generally to semiconductor devices and methods, and more particularly to memory arrays and methods of forming the same using etch bias homogenization.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change memory, conductive bridging memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Resistance variable memory devices include resistance variable memory cells that store data based on the resistance level of a storage element. The cells can be programmed to a desired state, e.g., corresponding to a resistance level, such as by applying sources of energy, such as positive or negative voltages to the cells for some duration. Some resistance variable memory cells can be programmed to multiple states such that they can represent, e.g., store, more than one bit of data.

The programmed state of a resistance variable memory cell may be determined, e.g., read, for example, by sensing current through the selected resistive memory cell responsive to an applied voltage. The sensed current, which varies based on the resistance level of the memory cell, can indicate the programmed state of the memory cell.

Memory devices are becoming increasingly smaller, with memory cell feature size shrinking. This allows for much higher memory cell device density on chips, and lower cost per memory cell. A memory device, such as a memory array, can have memory cells formed above control circuitry, e.g., decoding circuits, peripheral circuits, etc. When devices were relatively large, one level, e.g., layer, of metal was adequate to provide the metal interconnections of the memory device. In a single level metallization technique, contact can be made to the underlying control circuitry, e.g., silicon devices, by contact holes etched through dielectric materials separating the control circuitry from the conductive material, e.g., metal, used for interconnections. As memory device dimensions have shrunk, multilevel metallization techniques have been used to reduce certain metal dimensions.

DETAILED DESCRIPTION

Figure 1:
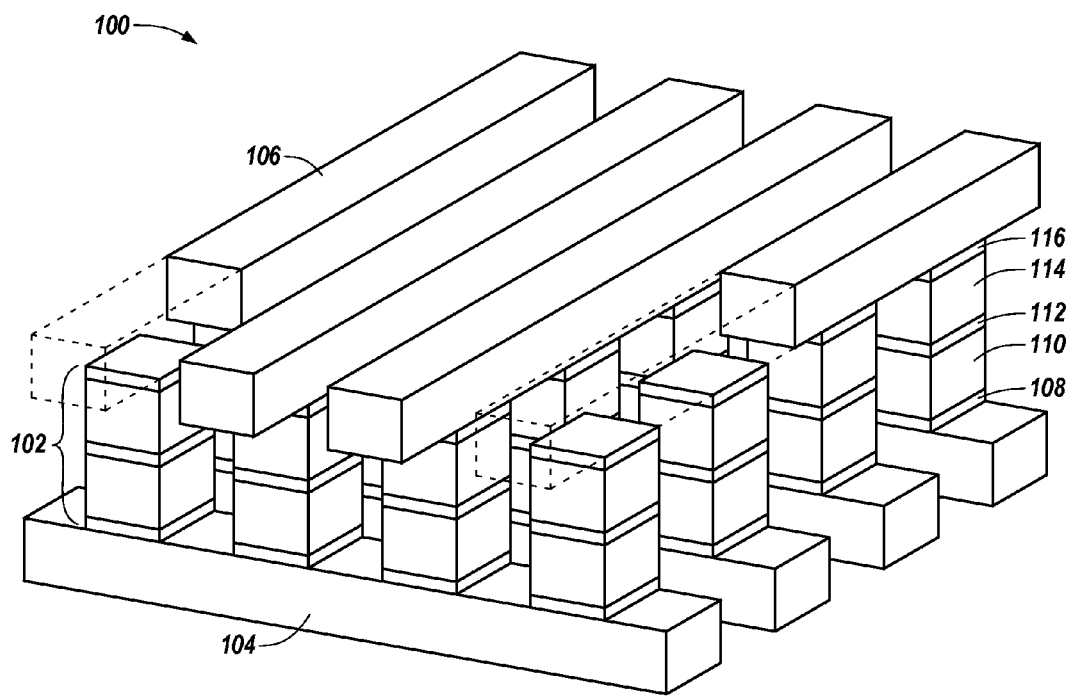
FIG. 1 illustrates a perspective view of a portion of a memory array in accordance with a number of embodiments of the present disclosure.

Methods and memory devices formed using etch bias homogenization are provided. One example method of forming a memory device using etch bias homogenization includes forming conductive material at respective levels over a substrate. Each respective level of conductive material is electrically coupled to corresponding circuitry on the substrate during patterning of the respective level of conductive material so that each respective level of conductive material has a homogenized etch bias during patterning thereof. Each respective level of conductive material electrically coupled to corresponding circuitry on the substrate is patterned.

Embodiments of the present disclosure can provide benefits such as homogenizing the process of patterning conductive materials with respect to electro-chemical effects of etch chemistries. Conductive materials can respond differently to etch chemistries depending on the electrical bias of the conductive materials. Electrically coupling conductive materials together and/or to their respective substrate devices/circuits can homogenize the electrical bias of the various conductive materials as they are patterned, e.g., etched, thereby achieving similar electro-chemical material removal results.

As used herein, a homogenized etch bias refers to establishing a substantially similar electrical potential for material being etched as is established for other material also being etched, or was established for the other material when it was previously etched. Homogenized etch bias may be achieved by electrically coupling conductive materials to one another, and optionally to a substrate, before and/or during a material removal portion of a patterning process, e.g., an etch, so as to subject each of the distinct conductive materials to same electro-chemical effects associated with a particular etch chemistry. That is, homogenized etch bias intends establishing equivalent electrical potential etching conditions across a plurality of conductive materials as they are respectively being etched. In this manner, residuals and/or conductive feature, e.g., line, collapse is less likely to occur. Homogenized etch bias may be achieved based on the conductive materials being electrically coupled, and the electrically-coupled conductive materials left floating, i.e., not electrically coupled to a reference potential, e.g., ground, or the electrically-coupled conductive materials also electrically coupled to a reference potential, e.g., grounded.

Leaving conductive materials all floating (with respect to substrate connections) during patterning or electrically coupling the conductive materials to a substrate, e.g., to an underlying silicon substrate during conductive line definition, can homogenize the electrical bias of the conductive materials during patterning, and improve the quality of patterning results as compared to previous approaches. While examples and descriptions provided herein may refer to only one of the floating or grounded configurations, embodiments of the present disclosure are not so limited and can be configured such that conductive materials being patterned can have a homogenized etch bias that is floating, that is isolated from a reference potential such a ground or substrate potential, and/or can have a homogenized etch bias that is electrically coupled to the reference potential such a ground or substrate potential.

Consistent patterning, e.g., etching, results from establishing homogeneous etch bias during patterning is especially beneficial where spaces between and/or tolerances of memory array features are small, such as for conductive lines associated with an active memory array in the array area and/or socket regions, among others.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 214 in FIG. 2. Also, as used herein, "a number of" a element and/or feature can refer to one or more of such elements and/or features.

FIG. 1 illustrates a perspective view of a portion of a memory array 100 in accordance with a number of embodiments of the present disclosure. The array 100 can be a cross-point array having memory cells 102 located at the intersections of a number of conductive lines, e.g., access lines 104, which may be referred to herein as word lines, and a number of conductive lines, e.g., data/sense lines 106, which may be referred to herein as bit lines. As illustrated, the word lines 104 are parallel to each other and are orthogonal to the bit lines 106, which are parallel to each other. However, embodiments are not limited to a parallel/orthogonal configuration. The word lines 104 and/or bit lines 106 can comprise, for example, a metal material such as tungsten, copper, titanium, and/or aluminum, among various other conductive materials and/or combinations thereof.

Each memory cell 102 can include a storage element coupled in series with a respective select device, e.g., access device, formed between word lines 104 and bit lines 106. The storage element can be a resistive storage element. The resistive storage element may include a material 110 formed between a pair of electrodes, e.g., 108 and 112. The select device can include a select device material 114 formed between a pair of electrodes, e.g., 112 and 116.

The memory cells 102 of array 100 can comprise a select device in series with a phase change material, such that the array 100 can be referred to as phase change material and switch (PCMS) array. However, embodiments of the present disclosure are not limited to PCMS cross-point arrays. For instance, the methods and apparatuses of the present disclosure can be applied to other cross-point arrays such as RRAM arrays and conductive bridging random access memory (CBRAM), for example.

Embodiments are not limited to storage elements comprising phase change materials. For instance, the storage elements can comprise one or more resistance variable materials such as binary metal oxides, colossal magnetoresistive materials, and/or various polymer-based resistive variable materials, among others.

In a number of embodiments, the resistive storage element material 110 can comprise one or more of the same material(s) as the select device material 114. However, embodiments are not so limited. For example, the resistive storage element material 110 and the select device material 114 can comprise different materials. According to various embodiments of the present disclosure, relative positioning of the resistive storage element material 110 and the select device material 114 can be reversed from that shown in FIG. 1.

The materials described herein may be formed by various techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Figure 2:
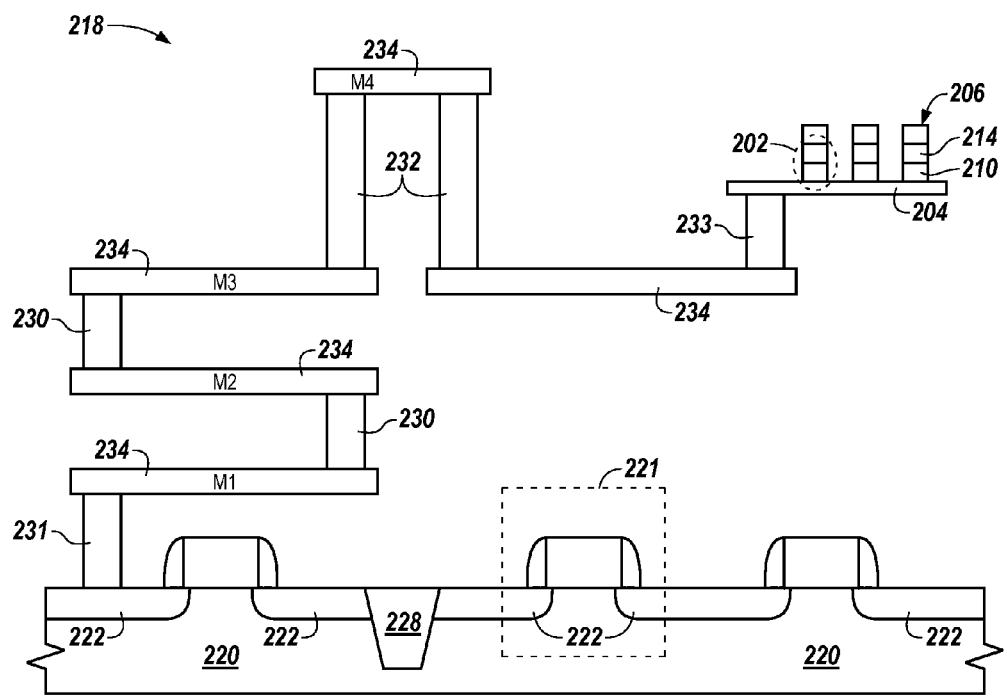
FIG. 2 illustrates a cross sectional view of a memory device using jumpers.

FIG. 2 illustrates a cross sectional view of a memory device 218 using jumpers. While FIG. 2 shows only a single deck memory array, embodiments of the present disclosure are not so limited, and the methods of the present disclosure can be applied to memory device 218 configurations involving multiple deck memory arrays, e.g., stacked memory arrays. For instance, stacked memory arrays can be formed in a back-to-back configuration sharing bit lines, for example, with the memory cells and bit lines being formed between exterior word lines.

Multilevel metallization techniques can be implemented using conductive materials, e.g., metal, insulated by dielectric material(s). Reference is made herein to common terms of usage such as "metallization techniques" so named by virtue of metal typically being used to implement low resistance interconnections. However, as used herein, "metallization techniques" are not limited only to being implemented with metal(s) (as defined by the periodic table), and can be implemented with other conductive materials.

An instance of conductive materials is referred to herein as a metal level, rather than the more commonly known term "metal levels" or "metallization levels" to reflect that such conductive materials, other than metals, can be used. The conductive materials used to form interconnections are referred to herein by the shorthand notation of M1, M2, etc., for metal level 1, metal level 2, respectively. Use of such generally understood shorthand notation is not to be interpreted as limiting the corresponding conductive materials only to metal(s) and/or limiting the corresponding conductive materials to "level" or "layer" configurations.

Although conductive materials, as used herein, generally refers to materials from which interconnections formed, e.g., metals, etc., it can also include materials from which a resistive memory cell is formed if such materials are not in a non-conductive state during etchings. That is, material comprising a resistive storage element and/or a select device may be treated as conductive materials during etching if the material is not in a non-conductive state during etching. For example, material comprising a resistive storage element and/or a select device may be configured to have a homogenized etch bias during etching thereof, as described herein for patterning conductive materials.

FIG. 2 shows the memory device 218 having a substrate 220. The substrate 220 can be fabrication of a semiconductor material such as silicon, for example. However, embodiments of the present disclosure are not limited to any particular substrate material composition and/or configuration. The substrate can be a full or partial wafer of semiconductor material such as silicon, gallium arsenide, indium phosphide, etc., a full or partial silicon-metal-on-insulator (SMOI) type substrate, such as a silicon-on-glass (SOG), silicon-on-ceramic (SOC), or silicon-on-sapphire (SOS) substrate, or other suitable fabrication substrate. As used herein, the term "wafer" includes conventional wafers as well as other bulk semiconductor substrates. The substrate 220 can be configured to have a number of semiconductor devices 221 formed therein, such as transistors, for example.

The semiconductor device 221 described above can be, for example, configured as an nMOSFET (n-type metal oxide semiconductor field effect transistor), which can be one of many comprising a bulk CMOS structure. The substrate 220 can include an n-well (not shown) within which p-type differently doped regions 222 can be formed in order to form a pMOSFET. The semiconductor devices 221 comprising a bulk CMOS structure are not limited to any particular configuration and can include one or more types of semiconductor devices 221. The substrate 220 can have isolation structures 228, e.g., shallow trench isolation structures, formed between certain ones of the number of semiconductor devices 221.

FIG. 2 shows the memory device 218 including a memory array, such as memory array 100 shown in FIG. 1. The memory array shown in FIG. 2 can include word lines 204 (shown being oriented horizontally across the page) and bit lines 206 (shown oriented into and out of the page perpendicular to the word lines 204). FIG. 2 further shows a memory cell comprising memory material 210 and select device material 214 located between intersections of the word lines 204 and bit lines 206. The various electrodes and other details of the memory cell are omitted from FIG. 2 for clarity.

FIG. 2 also shows the memory device 218 having a plurality of conductive materials 234, e.g., metal levels M1, M2, M3, and M4, which can be used to electrically couple portions of the array, e.g., conductive line 204 and 206, to the underlying substrate 220 and/or circuitry formed therein, e.g., via interconnections 230, 233, 231, and/or 232, as is discussed further below.

The first metal level formed above the substrate 220 is referred to herein as M1. Successive conductive material levels 234 are referred to herein as M2, ..., MN, where N is the number of the conductive material level with respect to the substrate 220 surface. The interconnections 230, 231, 232, and 233 can be conductive plugs comprising materials such as copper, aluminum, tungsten, and alloys thereof, among others.

As active memory array features, e.g., conductive lines such as bit lines 206 and word lines 204, are being patterned from a respective level of conductive materials, the conductive materials being patterned can be left floating or can be coupled to the substrate directly or directly through interconnections 230, 231, and 233 between the conductive lines of the memory array, metal levels, and the substrate 220. Interconnections 231 implemented under the conductive material 234 closest to the substrate 220 surface (referred to herein as metal level 1 (M1)), can make contact to the underlying control circuitry, e.g., lines, semiconductor devices 221, etc., through contact holes, just as can be accomplished by single level metallization schemes.

That is, connection of the respective conductive materials being patterned into conductive lines of the active memory array can be made before or after patterning of the respective conductive materials into the associated conductive line. If electrical coupling to the substrate 220 is to be made after patterning of a particular conductive material into conductive lines of the active memory array, jumpers 232 can be subsequently formed to higher elevation metal levels and/or to lower level metal layers to complete the electrical path to the substrate 220 below. If electrical coupling to the substrate 220 is to be made before patterning of a particular conductive material into conductive lines of the active memory array, the electrical path to the substrate 220 can be made through those previously-formed and patterned conductive materials below, e.g., M1, M2, M3, etc. prior to patterning the respective conductive materials into particular conductive lines of the active memory array.

In this manner, the electrical bias of the respective conductive materials, i.e., the entire level before patterning actually forms discrete conductive lines therefrom, can be homogenized to all be all floating or all to have the connections to the substrate in place during patterning thereof.

Connections between devices and/or circuits, e.g., decode logic, formed in the bulk substrate and the conductive lines of the memory array, e.g., word lines 204 and/or bit lines 206, can be made through portions of one or more of the metal levels. For example, FIG. 2 illustrates that conductive material comprising the word lines 204 can be electrically coupled to metal level M3 by interconnection 233.

However, during patterning of the conductive lines, e.g., word lines 204 and/or bit lines 206 of the active memory array, the interconnections 232 (referred to herein as a "jumper" 232) and metal level M4 do not exist. As such, the conductive lines 204 and bit lines 206 are not electrically connected to the substrate 220 and/or circuitry, e.g., semiconductor devices 221, therein during patterning thereof. That is, the conductive lines 204 and/or 206 can be left floating during patterning thereof. Subsequent to patterning of the conductive lines 204 and/or 206, the jumpers 232 and metal level M4 can be formed so as to electrically connect the conductive lines to the active memory array to the substrate 220. Note that FIG. 2 is not drawn to scale, particularly with respect to the dimensions of the memory array components, semiconductor devices 221, interconnections 230, 231, 233, and jumpers 232.

However, it can be beneficial to homogenize the etch bias of respective conductive materials during patterning of associated conductive lines of the memory array, e.g., word lines 204 and bit lines 206, by connection to the substrate prior to and/or during patterning. This can enable formation of the various interconnections before patterning overlying conductive materials into conductive lines, etc. FIGS. 3-6 describe various methods and structures for homogenizing the etch bias of conductive materials from which conductive lines of an active memory array are patterned to that of the substrate and 220 and/or circuitry, e.g., semiconductor devices 221, therein.

Circuits associated with an active memory array may extend beyond the footprint of the active memory array and/or associated socket regions. For a number of reasons, inactive arrays (also referred to as "dummy arrays) may be formed over some or all of the circuits associated with an active memory array may extend beyond the footprint of the active memory array and/or associated socket regions. An inactive array is an array that is not operable to store information. A "tile" refers to an array area. The term "dummy tile" refers to an inactive array area. A dummy tile can include some or all portions of the components, e.g., conductive lines such as word lines and bit lines, in an active memory array, and may or may not be configured to be fully operational.

Conductive lines may be formed for the inactive arrays. The conductive lines of the inactive array can be formed from the same level of conductive materials from which conductive lines of the active memory array are formed. Being a continuous level of conductive material prior to and during the majority of patterning, i.e., until patterning isolates portions of the conductive material level into discrete features such as conductive lines, the electrical etch bias of the conductive material from which conductive lines associated with the inactive arrays is homogeneous with the conductive material from which conductive lines associated with the active arrays.

In patterning those conductive levels from which conductive lines of the active (and inactive) arrays are formed after establishing a connection from the conductive material to underlying metal layers and/or the substrate, the conductive materials can have a homogeneous etch bias, e.g., electrical potential, not only within the conductive material level, but also with respect to the conductive materials at other levels. That is, conductive materials at various levels can be brought to a homogeneous etch bias before and during patterning to achieve similar etch chemistry results among all conductive material levels.

Figure 3:
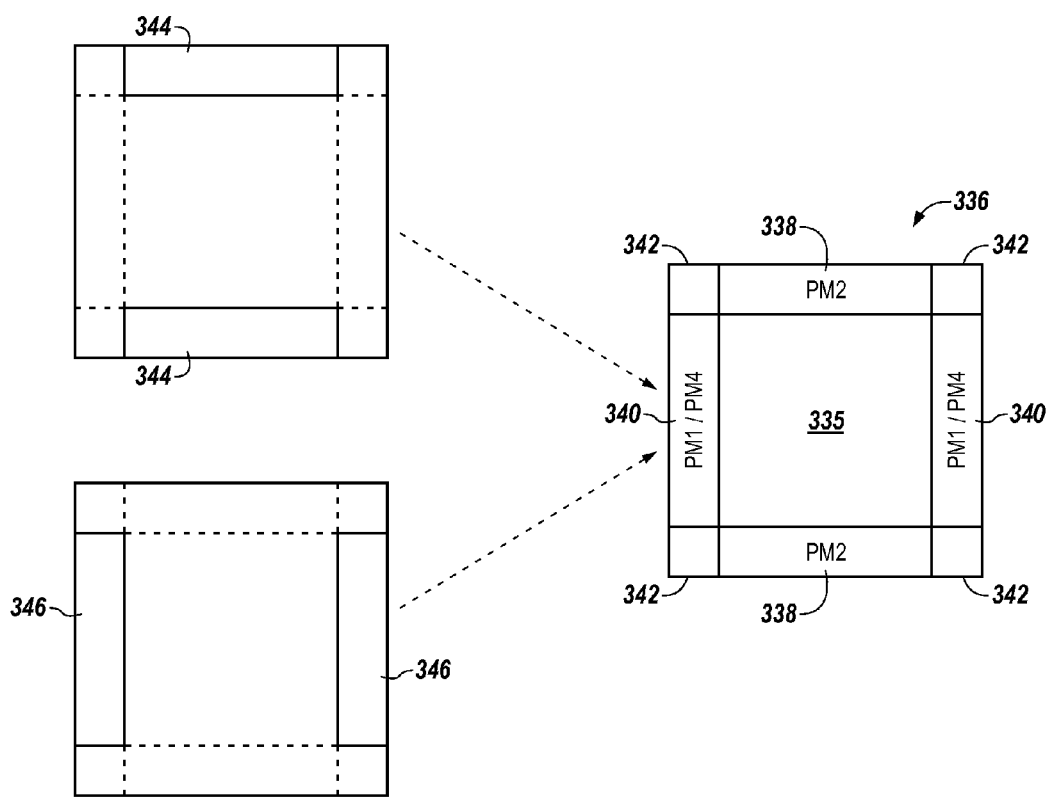
FIG. 3 illustrates a local dummification strategy for etch bias homogenization in accordance with embodiments of the present disclosure.

FIG. 3 illustrates a local dummification strategy for etch bias homogenization in accordance with embodiments of the present disclosure. Conductive materials within the various areas shown in FIG. 3 can have a homogenized etch bias during patterning thereof. FIG. 3 shows various areas associated with a memory array area 335, and how the memory array area 335 relates to other parts of the device. It can be desirable to place all of the circuitry associated with a memory array, e.g., decoding circuitry, etc., beneath the memory array. In this manner, the footprint associated with a memory array can be minimized. However, in order to make vertical connections with the decoding circuitry below the memory array area 335, word lines and bit lines associated with the array can be typically routed outside the memory array area 335 to adjacent socket regions, from which vertical interconnections can be made.

Interconnections from the word lines and bit lines associated with the array to the decoding circuitry beneath can typically be confined to a socket region adjacent a side of the memory array. For example with respect to memory array 335 shown in FIG. 3, and assuming the bit lines are oriented vertically on the figure and the word lines are oriented horizontally on the figure, bit line socket regions 338 can be used within which to form vias and interconnections therein between the bit lines at one level and bit line decoding circuitry at another level. For example, a 256×256 memory array can have 256+2*r number of word lines, where r is the quantity of rows in a bit line socket region 338. The number of word lines cut, in the region identified by the cut mask 344, is 2*r where the word lines are being cut within two sockets, e.g., one socket on each of two sides of the array. Therefore, 2*r is a total number of word lines cut using mask 344, in order to not make them interfere with routing of bit lines in the socket regions.

Similarly, word line socket regions 340 can be used within which to form vias and interconnections therein between the word lines at one level and word line decoding circuitry at another level. For example, a 256×256 memory array can have 256+2*c number of bit lines, where c is the quantity of columns in a word line socket region 340. Therefore, 2*c is a total number of bit lines cut using mask 346, in order to not make them interfere with routing of word lines in the socket regions.

According to one or more embodiments, with regards to a stacked memory array, e.g., two decks formed in a back-to-back configuration sharing bit lines with the memory cells. Conductive lines and vias shown in FIG. 5 associated with a particular memory array are labeled with a preceding "P," e.g., PM1 refers metal level 1 of a particular memory array and PV1 refers to via 1 of a particular memory array, e.g., a phase change material and switch (PCMS) memory array. Bit lines being formed between exterior word lines, bit line socket region 338 can be used as a socket region for the common bit lines (PM2) shared among the two decks (of memory arrays), and the word line socket region 340 can be used as a socket region for the deck-dedicated word lines of the first (PM1) and second (PM4) deck, respectively.

The regions adjacent a bit line socket region 338 and word line socket region 340 are the corner regions, which are sometimes referred to as the so-called "magic boxes." Conventionally, the corner region can be used to locate a variety of circuitry associated with the memory array, typically other than line decode circuitry, which can be located beneath the memory array 335. The corner regions can be filled with a number of dummy, i.e., non-functional, mini-tiles, e.g., mini-arrays, in order to help with chemical mechanical polishing (CMP) landing control.

Furthermore, according to various embodiments of the present disclosure, bit line cut masks 344 can be used to remove word lines from the bit line socket regions 338, and word line cut masks 346 can be used to remove bit lines from the word line socket regions 340 so that respective socket regions can be used for vertical transitions of either word lines or bit lines. This can be further observed in the side view presented in FIG. 5, which shows the vertical connections (using vias) of the word lines in respective word lines socket regions and of the common bit lines in a bit line socket region. Of course, the bit line cut masks 344 and word line cut masks 346 are formed at different times in the fabrication process, and at different levels corresponding to the conductive materials being removed from the respective socket regions. According to one example implementation, the bit lines and/or word lines are formed to be 32 nm lines.

The various transition regions from active array lines, e.g., bit lines and/or word lines, can be managed like in the memory array area 335. That is, bit line cut masks 344 to remove the PM1/PM4 conductive materials from the bit line socket regions 338 can correspond to the whole bit line socket region 338, and word line cut masks 346 to remove the PM2 conductive materials from the word line socket regions 340 can correspond to the whole word line socket region 340. Additional features of the respective cut masks to achieve standard socket finishing (e.g., separation of closed loops in the socket regions to remove shorts between conductive lines) are omitted from FIG. 3 for simplification and clarity.

Figure 4:
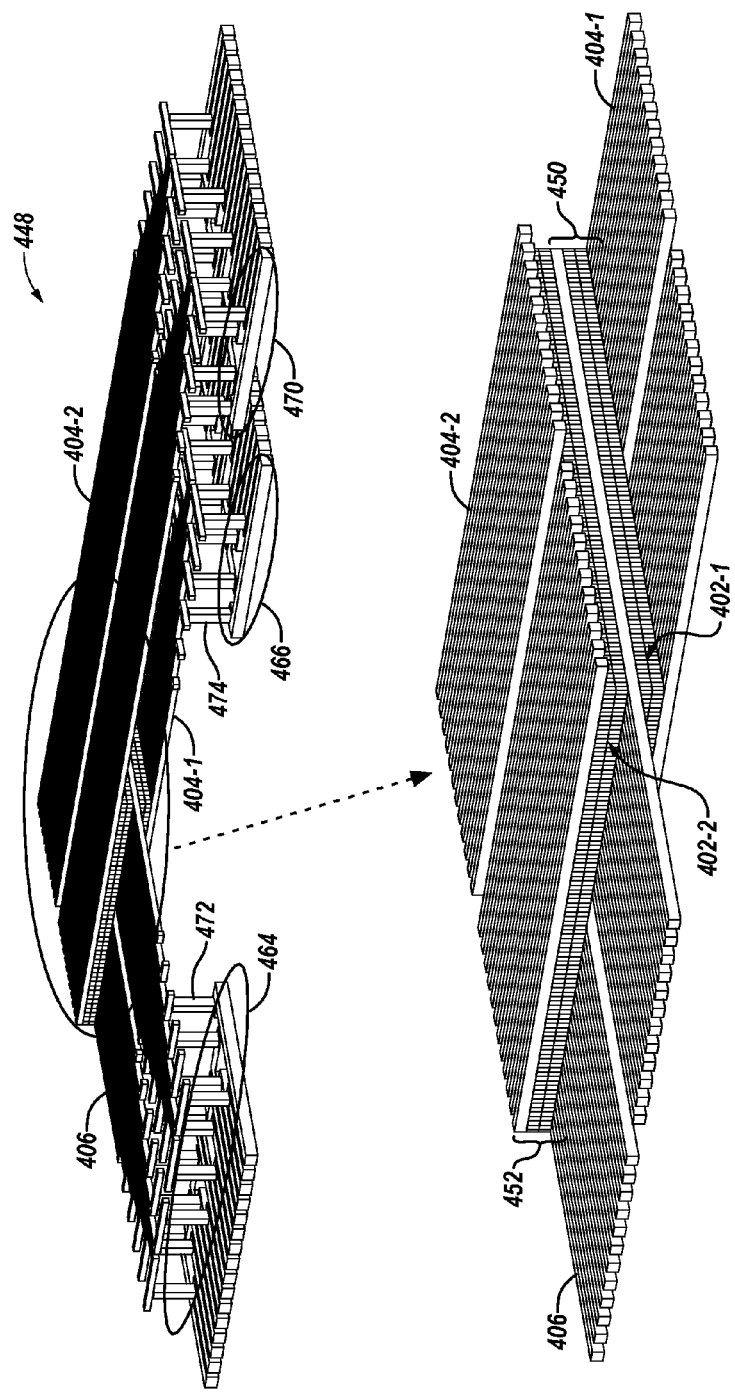
FIG. 4 illustrates a perspective view of a two-deck memory array in accordance with embodiments of the present disclosure.

FIG. 4 illustrates a perspective view of a two-deck memory array in accordance with embodiments of the present disclosure. A two-deck memory array is shown in FIG. 4 in order to illustrate more complex features and arrangements than are associated with a single-deck memory array. However, embodiments of the present disclosure are not limited to two-deck memory arrays, and may be applied with respect to single- and/or multiple-deck arrays.

FIG. 4 shows a three dimensional overview of an active memory array architecture, including a first (memory array) deck 450 and a second (memory array) deck 452. The first deck 450 can be the lower deck and can include a number of memory cells 402-1. The second deck 450 can be the upper deck and can include a number of memory cells 402-2.

Bit lines 406 common to each of the first deck 450 and second deck 452 can extend out of the memory array area (towards the lower-left in FIG. 4) to a bit line socket region where bit line interconnections 472 are made between the bit lines 406 and circuitry 464 therebelow, e.g., bit line decode circuitry.

Word lines 404-1 corresponding to the first deck 450 and word lines 404-2 corresponding to the second deck 452 can extend out of the memory array area (towards the lower-right in FIG. 4) to respective word line socket regions where respective word line interconnections 474 can be made between the respective word lines 404-1 and 404-2 and respective circuitry therebelow, e.g., first word line decode circuitry 466 and second word line decode circuitry 470.

In various memory device embodiments, in order to minimize memory device size, memory arrays can create a dense cluster and can be packed close to each other to the extent possible, with attempts made to try to fit all the circuitry associated with an array underneath the array. The corner regions can be used for dedicated vias to underneath metal levels and can possibly be routed to ground using any Vss rail available in the array decoding region. In attempting to decrease the footprint associated with an active memory array, there may not be room in which to form jumpers, e.g., 232 shown in FIG. 2, to higher metal levels, e.g., M4, in order to complete connections from the active memory array to the substrate. Connections from the active memory array to the substrate may have to be made to lower metal levels and/or the substrate before patterning conductive materials to form conductive lines of the active memory array.

According to one or more embodiments of the present disclosure, it may be necessary for some portion of the circuitry associated with an array such as bit line decoders or word line decoders in the external architecture, logic for built-in microcontroller, input/output drivers, and the like, to be located outside to the array boundaries. Therefore, a further dummification strategy can be implemented for such regions (of circuitry located outside to the array boundaries, socket regions, and corner regions) which can optionally also include the grounding of associated structures.

Figure 5:
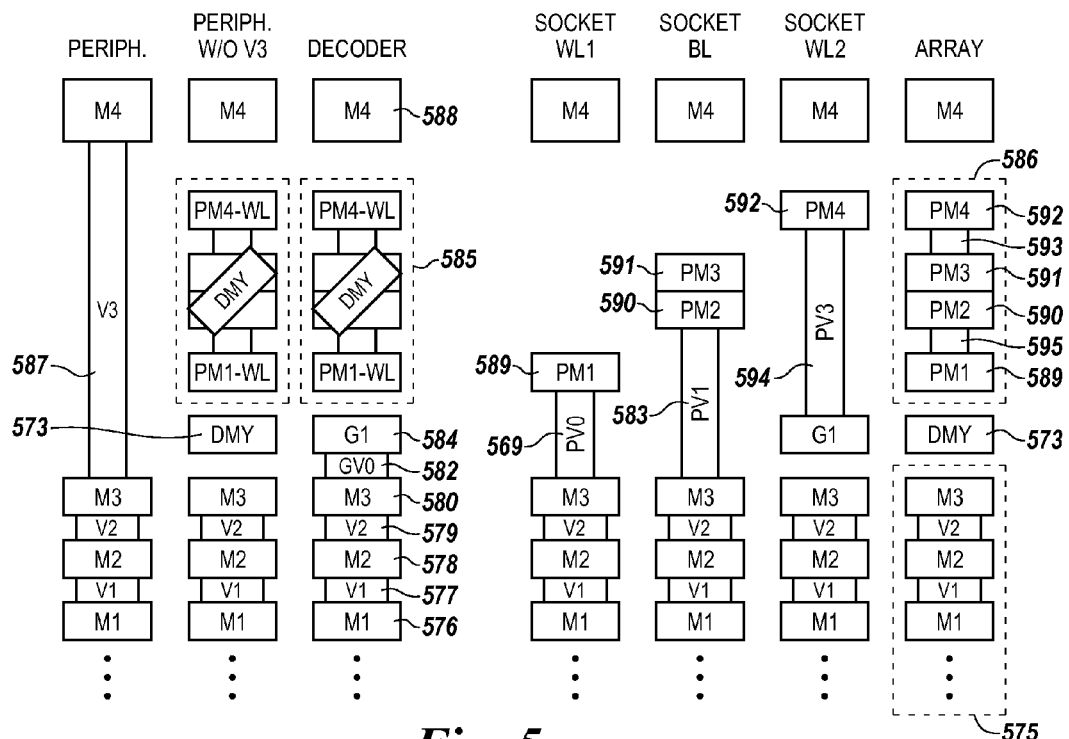
FIG. 5 illustrates a block diagram of a metallization scheme for a two-deck memory array in accordance with embodiments of the present disclosure.

FIG. 5 illustrates a block diagram of a metallization scheme for a two-deck memory array in accordance with embodiments of the present disclosure. The metallization scheme illustrated in FIG. 5 provides one example for electrically coupling the various conductive materials together, and to a substrate, so as to similarly homogenize the etch bias on each conductive material during patterning thereof. The metallization scheme illustrated in FIG. 5 is based on a phase change material and switch (PCMS) cross-point memory device having two memory array decks with 3+1 metal levels below the elevation of the memory array. The 3+1 metal levels include M1, M2, M3, and G1. The fifth metal level, M4, can be aluminum routing above the elevation of the memory array, which can be used to form the landing pads for further electrical connections. However, embodiments of the present invention are not limited to the metallization scheme illustrated in FIG. 5, and etch bias homogenization including connection to the substrate can be implemented in other connection schemes with more or fewer memory array decks and/or metal levels.

As shown and discussed with respect to FIG. 3, one or more bit line socket regions and one or more word line socket regions can be located outside of the array region for each deck of the memory array. For example, for a two deck memory array with common bit lines can have one or more bit line socket regions and one or more word line socket regions outside of the array region for each of the first and second decks.

Some circuitry associated with an active memory array can extend outside of the array and socket regions. For example, decoder circuitry and peripheral circuitry can extend outside of the array and various socket regions. The circuitry that extends outside of the array and socket regions can be delineated into several areas, for example, a decoder area and a peripheral area. The peripheral area can be further delineated into peripheral areas with and without a V3 via. Other areas can be defined as containing other classifications of circuitry. The metallization and/or connection schemes of these additional circuit areas can be the same or different than shown for the decoder and peripheral areas shown in FIG. 5. That is, additional circuit areas can have the same or different interconnections than those shown for the areas depicted in FIG. 5.

The various circuit areas outside of the array and socket regions, e.g., peripheral area, peripheral without V3 area, and decoder area, include circuitry associated with the active memory array, which is located in the array region. These various circuit areas outside of the array and socket regions can have one or more inactive arrays formed thereabove, as is discussed further with respect to FIG. 6 below. The inactive arrays formed above the various circuit areas outside of the array and socket regions can help facilitate providing a homogenized etch bias.

The metallization scheme illustrated in FIG. 5 provides details of the interconnections between the conductive materials at particular levels. Interconnections may be implemented in certain areas associated with an array. FIG. 5 shows the various interconnections for areas including the array area, the bit line socket region (the bit lines being shared by the two array decks), each of two word line socket regions, a decoder circuitry area, and several peripheral areas.

Not shown in FIG. 5 below M1, and represented by the ellipsis (" . . . ") symbol, is the bulk CMOS and associated circuitry formed on the substrate. The bulk CMOS can include, for example, a writing circuit, a sensing circuit, and a controller, which are not shown in the accompanying drawings. The controller can control the sensing circuit and the writing circuit. The writing circuit can set the memory states of the memory cells, and the sensing circuit can read the memory states of the memory cells. Connections between M1 and the underlying bulk CMOS and associated circuitry can be made by conventional means in order to complete an electrical path between the conductive materials at various levels and the substrate.

Processing steps to form the various components of the memory array and other areas can occur after a substrate wafer has control circuitry, e.g., CMOS decoding circuitry, and conductive material, e.g., metal, back-end already in place. This example metallization scheme is described with respect to PCMS memory cells. However, embodiments of the present disclosure are not limited to a particular technology and/or materials. Methods of the present disclosure can be implemented with additional material/structure formation and/or different interconnection arrangements that accomplish etch bias homogenization involving connection to the substrate prior to and during patterning of various conductive materials so as to achieve similar etch chemistries.

The metallization scheme is intended to provide a way to electrically couple each and every level of conductive materials together, so that the respective materials can have a homogeneous etch bias during patterning of each level of conductive materials. The conductive materials at different levels can include not only the metal levels, M1, M2, M3, and G1, but also the various bit line and word line conductive materials within the memory array and extending into associated socket regions.

The 3+1 metal levels, e.g., M1, M2, M3, and G1, and the routing metal level, M4, can be present in each of the regions and areas, as indicated in FIG. 5. A first metal level 576 (M1) can be electrically coupled to a second metal level 578 (M2) by a first via 577 (V1), and the second metal level 578 (M2) can be electrically coupled to a third metal level 580 (M3) by a second via 579 (V2). The 3 metal levels, e.g., M1, M2, and M3, and the bulk CMOS can be referred to as the bulk CMOS metal levels 575. While example configuration presented in FIG. 5 utilizes 3+1 metal levels, embodiments of the present disclosure are not so limited, and the bulk CMOS metal levels 575 can include more or fewer metal levels, in a same or different arrangement. From the perspective of an electrical pathway by which to interconnect conductive lines located at higher levels to the substrate, the metal levels in the plurality of metal levels is that used to establish appropriately-routed electrical pathways therethrough.

The electrical coupling between metal levels can be established before and during patterning of the upper metal level. That is, the unpatterned conductive material of a metal level can have interconnections, such as by using vias, to a lower (patterned) metal level prior to and during patterning of the conductive material of the metal level. In this manner, the unpatterned conductive material of the metal level can have a homogenized etch bias with lower metal layers, which are connected to the substrate. As such, the conductive material for each successive metal level can have a similar homogenized etch bias during patterning thereof FIG. 5 describes one scheme for making the necessary interconnections between various metal levels.

The G1 metal level 584 can be electrically coupled to the third metal level 580 (M3) by a via 582 GV0 therebetween. This interconnection can be implemented in the decoder circuitry area, for example. Vias V1, V2, and GV0 can be vias filled, for example, with copper. The top metal level under the array, i.e., G1, is referred to herein as the "glue" metal level 584, the use of which is discussed in further detail below.

The aluminum routing metal level 588 (M4) can be connected to the third metal level 580 (M3) by a via 587 (V3). As shown in FIG. 5, this interconnection can be made in one of the peripheral areas shown at the far left in FIG. 5, e.g., in which no dummy tiles are formed.

As shown in the array area at the far right in FIG. 5, the active memory array area 586 can include several level of conductive materials, including bit lines and word lines. FIG. 5 shows the active memory array area 586 including, from the bottom up, PM1 conductive material 589 for the word lines of the lower deck, PM2 conductive material 590 for the bit lines of the lower deck, PM3 conductive material 591 for the bit lines of the upper deck, and PM4 conductive material 592 for the word lines of the upper deck. PM2 conductive material 590 for the bit lines of the lower deck and PM3 conductive material 591 for the bit lines of the upper deck are essentially shunted together by their adjacent formation.

Phase change material 595 for the memory cells and/or select device is located between the PM1 conductive material 589 for the word lines of the lower deck and PM2 conductive material 590 for the bit lines of the lower deck. Phase change material 593 for the memory cells and/or select device is located between the PM4 conductive material 592 for the word lines of the upper deck and PM3 conductive material 591 for the bit lines of the upper deck. However, details with respect to individual formation of the memory cell, select device, and/or electrode therebetween are omitted from FIG. 5 for clarity. The respective labels, e.g., PM1, PM2, PM3, and PM4, for the conductive materials of the active memory array area 586 correspond to those indicated in FIG. 3.

The conductive materials comprising the overlapping bit lines and word lines of a memory array extend out from the memory array to adjacent socket regions, as was discussed with respect to FIGS. 3 and 4. Therefore with respect to FIG. 5, the PM4 conductive material 592 for the word lines of the upper deck extends from the array area to the WL2 socket region, i.e., the word line socket region associated with the upper memory array deck. FIG. 5 shows that in the WL2 socket region the PM4 conductive material 592 for the word lines of the upper deck can be connected to the glue level G1 through a via 594 (PV3). Via PV3 can be filled, for example, with tungsten to make the interconnection between PM4 and G1.

Glue level G1 in the WL2 socket region can be electrically coupled to the glue level G1 in the decoder area. For example, the glue level G1 can have conductive lines that extend between the WL2 socket region and the decoder area. The glue level G1 conductive lines can form a grid in some implementations in the decoder area and/or WL2 socket region. As previously discussed, the G1 metal level 584 can be electrically coupled to the third metal level 580 (M3) by a via 582 (GV0) in the decoder circuitry area. Therefore, the PM4 conductive material 592 for the word lines of the upper deck can be connected all the way to the substrate prior to and/or during patterning thereof without the use of jumpers to later-formed higher metal levels as shown and described with respect to FIG. 2. That is, the PM4 conductive material 592 can have a similar homogenized etch bias all the way to the substrate during patterning thereof just like is the case for other metal levels and other memory array conductive material levels so that etch chemistry will be similar in order to produce consistently similar fabrication results.

In this above-described manner, the conductive material from which some word lines are formed can be homogenized to a similar electric bias all the way to the substrate during patterning thereof.

The G1 metal level 584 can be used for routing a word line of the first deck or of the second deck, depending on the position of the word line decoders. In FIG. 5, G1 is shown being used to route the word line of the second memory array deck.

FIG. 5 shows isolated dummy portions 573 of the glue level formed in the memory array area and the peripheral without V3 area. Although these dummy portions 573 of the glue level are shown in FIG. 5 as not electrically coupled to conductive materials at higher or lower elevations, e.g., they may not be needed in establishing an electrical path to the substrate for conductive materials at a higher elevation, embodiments of the present disclosure are not so limited and the dummy portions 573 of the glue level can be used where appropriate for portions of an electrical path to the substrate. For example, an interconnection between some conductive material from which a conductive line associated with an inactive array can be made to and/or through the dummy portions 573 of the glue level in some implementations. The dummy portions 573 of the glue level can be formed in the aforementioned areas as filler, e.g., to keep the various materials formed in each area at relatively the same height and/or thickness, since no vias need to pass through these areas.

Similarly, one or more inactive arrays 585, e.g., dummy arrays, can be formed in the decoder and peripheral without V3 areas as filler since no vias need to pass through these areas at the elevation of the inactive arrays 585. Although not shown in FIG. 5 with respect to the inactive arrays 585 for clarity, connections between the inactive arrays 585 and the glue layer G1 can be accomplished using the same socket connections as is shown and described for the active array. That is, before etching to isolate features of the inactive array from similar features of the active array, the conductive material from which the respective features are formed is contiguous, and thus electrically homogeneous. Therefore, electrically coupling PM4 592 to the glue layer G1 in socket WL2 as shown in FIG. 5, also electrically couples PM4-WL of each of the inactive arrays to the glue layer G1 before etching, and during etching until the etch separates the PM4 features of the inactive arrays from features of the active arrays. The inactive arrays and glue layer G1 in the decoder area is discussed further with respect to FIG. 6 below.

The PM1 conductive material 589 for the word lines of the lower deck extends from the array area to the WL1 socket region, i.e., the word line socket region associated with the lower memory array deck. FIG. 5 shows that in the WL1 socket region the PM1 conductive material 589 for the word lines of the lower deck can be connected to M3 through a glue via 569 (PV0). Via PV0 can be filled, for example, with tungsten to make the interconnection between PM1 and M3.

The PM2 conductive material 590 for the bit lines of the lower deck extends from the array area to the bit line socket region. FIG. 5 shows that in the bit line socket region the PM2 conductive material 590 for the bit lines of the lower deck can be connected to M3 through another glue via 583 (PV1). Via PV1 can be filled, for example, with tungsten to make the interconnection between PM2 and M3. As PM3 conductive material 591 for the bit lines of the upper deck are essentially shunted to PM2 conductive material 590 for the bit lines of the lower deck, the interconnection from PM2 to M3 electrically couples both the PM2 and PM3 conductive materials together and to the M3 (which of course are further connected to M2 and M1, among others). Although PM2 and PM3 are shown in FIG. 5 being discrete materials, embodiments of the present disclosure are not so limited. According to various embodiments, PM2 590 and PM3 591 may be formed as a same, e.g., single, material.

Figure 6:
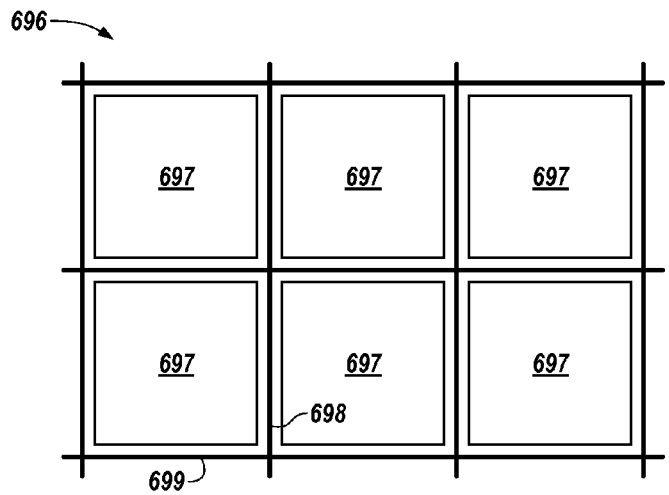
FIG. 6 illustrates a block diagram of a glue level grid around inactive arrays in accordance with embodiments of the present disclosure.

FIG. 6 illustrates a block diagram of a glue level grid around inactive arrays in accordance with embodiments of the present disclosure. FIG. 6 shows a number of inactive arrays 697, e.g., dummy tiles, with a grid 696 of glue level G1 conductive lines 699 formed around each inactive array 697 as may be implemented, for example, in the decoder area (as shown in FIG. 5). As shown and discussed with respect to FIG. 5, the inactive arrays 697 and glue level G1 conductive lines 699 are formed at different elevations.

The conductive lines 699 at the glue level can be used to form a solid and regular grid 696 around inactive arrays 697. The grid 696 can be connected to a reference potential such as Vss, a negative supply rail, and/or ground reference potential, for instance. Conductive materials used to form components of the inactive arrays, e.g., bit lines and word lines, can be connected to this grid 696, for example, using dedicated sockets, which can help to homogenize the conductive materials used to form components, e.g., conductive lines, of the inactive arrays during patterning to that of the conductive materials used to form components, e.g., conductive lines, of the active arrays during patterning. As shown in FIG. 6, the Vss grid 696 can be configured to surround each of the inactive arrays 697.

The inactive arrays 697 can be configured to resemble the active memory array in order to take advantage of process uniformity. According to one or more examples, the inactive arrays 697 can be comprised of 256×256 dummy (memory) cells. The inactive arrays 697 can be arranged to fill-in otherwise unused spaces around the active memory array above circuitry associated with the active memory array that resides outside the array and socket regions. According to some embodiments, the inactive arrays 697 can have different sizes, e.g., other than 256×256 dummy (memory) cells, in order to fill otherwise unused spaces around the active memory array more efficiently. According to various embodiments, the inactive arrays 697 can be placed automatically, i.e., by automated layout tools in areas over substrate circuitry not otherwise needed for interconnections to conductive materials at higher elevations, to fill otherwise unused spaces around the active memory array.

The inactive arrays 697 can be spaced apart be less than approximately 1 micrometer. The G1 conductive lines 699 comprising the grounding grid 696 (e.g., Vss) can be located with the space between inactive arrays 697. The G1 conductive lines 699 comprising the grounding grid 696 can be approximately 0.5 micrometer in width, for example.

According to some embodiments, the conductive material comprising the G1 metal level can also be used inside the grounding grid 696 for signal paths used for local routing, e.g., with the confines of an inactive array 697, of other signal(s). For instance, a tool for placement of certain features, e.g., conductive paths, can be run before finalization of a chip in order to allow this further use of the G1 conductive material for local routing within the confines of the inactive array 697. However, local routing of conductive lines formed at the G1 level within an inactive array cannot cross or impinge on the grounding grid 696 of conductive lines 699 surrounding each inactive array 697, and/or the space between inactive arrays.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory device, comprising:
   forming conductive material at respective levels over a substrate;
   electrically coupling a first portion of the conductive material in an active array area to corresponding circuitry on the substrate via a second portion of the conductive material in an inactive array area during patterning of a particular one of the respective levels of conductive material so that each respective level of conductive material has a homogenized etch bias as that of another particular one of the respective levels of conductive material during patterning thereof; and patterning each respective level of conductive material electrically coupled to corresponding circuitry on the substrate.

2. The method of claim 1, wherein patterning each respective level of conductive material includes patterning the conductive material into word and/or bit lines in the active array area.

3. The method of claim 1, wherein electrically coupling each respective level of conductive material to corresponding circuitry on the substrate includes electrically coupling a first conductive material from which conductive lines of an active memory array will be patterned through conductive material at a glue level G1.

4. The method of claim 3, further comprising forming an interconnection between the conductive material from which conductive lines of an active memory array will be patterned and the conductive material at the glue level G1 in a first socket region adjacent an active memory array area.

5. The method of claim 4, further comprising forming an interconnection between the conductive material at the glue level G1 and a lower metal in an area outside the first socket region and the active memory array area.

6. The method of claim 4, wherein electrically coupling each respective level of conductive material to corresponding circuitry on the substrate includes:
   electrically coupling a second conductive material from which conductive lines of an active memory array will be patterned to a lower metal level in a second socket region; and
   electrically coupling a third conductive material from which conductive lines of an active memory array will be patterned to the lower metal level in a third socket region.

7. The method of claim 3, wherein electrically coupling conductive material from which conductive lines of an active memory array will be patterned through conductive material at a glue level G1 includes forming a grid of conductive lines in an area outside the socket region and the active memory array area from the conductive material at a glue level G1, the grid of conductive lines being formed around each of a number of inactive arrays.

8. The method of claim 3, further comprising forming an interconnection between a metal level above conductive materials from which conductive lines of the active memory array are patterned in an area outside the socket region and the active memory array area that does not have inactive arrays formed therein.

9. A method of forming a memory device, comprising:
   forming an active memory array in an active array area using a plurality of conductive material levels;
   forming a number of conductive line socket regions adjacent edges of the array area;
   forming a number of first inactive arrays in corner regions adjacent a number of conductive line socket regions; and
   forming a number of second inactive arrays outside of the array area, the number of conductive line socket regions, and the corner regions
   wherein forming an active memory array in an array area using a plurality of conductive material levels includes:
      forming conductive material at respective levels over a substrate;
      electrically coupling a first portion of the conductive material in the active array area to corresponding circuitry on the substrate via a second portion of the conductive material inside the second inactive array area during patterning of a particular one of the respective levels of conductive material so that each respective level of conductive material has a homogenized etch bias as that of another particular one of the respective levels of conductive material during patterning thereof; and
   patterning each respective level of conductive material electrically coupled to corresponding circuitry on the substrate.

10. The method of claim 9, further comprising forming a grid of conductive lines around each of the second inactive arrays at a first conductive material level lower than the active memory array,
   wherein the grid of conductive lines is electrically coupled to a conductive material level at a higher elevation in one of the number of conductive line socket regions, and the grid of conductive lines is electrically coupled to a conductive material level at a lower elevation in an area outside the array area and the number of conductive line socket regions.

11. The method of claim 10, wherein forming the grid of conductive lines includes forming an interconnection between first conductive material level lower than the active memory array and a next lower metal level before patterning the grid of conductive lines from the first conductive material level lower than the active memory array.

12. The method of claim 11, wherein forming the grid of conductive lines includes forming the first conductive material over metal levels M1, M2 and M3, the first conductive material being a metal material.

13. The method of claim 10, further comprising forming, inside the grid of conductive lines, local signal paths using the first conductive material level lower than the active memory array, wherein the local signal paths do not intersect the grid of conductive lines around each of the second inactive arrays.

14. The method of claim 10, wherein forming the number of second inactive arrays includes spacing apart the second inactive arrays by less than approximately one micrometer, conductive lines comprising the grid of conductive lines being located in spaces between the second inactive arrays.

15. The method of claim 10, further comprising sizing and placing the second inactive arrays to fill-up available space in an area adjacent the array area and conductive line socket regions over which circuitry associated with the active memory array is formed on a substrate.

16. The method of claim 9, wherein forming the number of second inactive arrays includes forming a number of second inactive arrays having different sizes in areas above circuits formed on a substrate associated with the active memory array.

17. A method of forming a memory device, comprising:
   forming over a substrate a plurality of metal levels metal levels coupled to CMOS devices associated with an active memory array in each of an active array area, an inactive array area, a first socket region, a second socket region, a third socket region, a decoder area, a first peripheral area, and a second peripheral area;
   electrically coupling the plurality of metal levels metal levels so as to have a homogenized etch bias during patterning thereof by:
      interconnecting a lowest metal level of the plurality of metal levels to the substrate during patterning of the lowest metal level;
      interconnecting each higher metal level of the plurality of metal levels to a respective lower metal level of the plurality of metal levels during patterning of each higher metal level;
      forming a glue metal level over a highest metal level of the plurality of metal levels;

interconnecting the glue metal level in the inactive array area to the highest metal level before patterning the glue metal level;
forming the active memory array in the array area over the glue metal level; and
forming a metal level over the glue level in each of an array area, a first socket region, a second socket region, a third socket region, a decoder area, a first peripheral area, and a second peripheral area.

18. The method of claim 17, wherein interconnecting the glue metal level to the highest metal level of the plurality of metal levels includes interconnecting the glue metal level to the highest metal level only in the decoder area located outside the array area, the first socket region, the second socket region, the third socket region, and the first and second peripheral areas.

19. The method of claim 18, further comprising:
interconnecting first conductive lines of the active memory array to the highest metal level of the plurality of metal levels only in the first socket region during patterning of the first conductive lines; and
interconnecting second conductive lines of the active memory array to the highest metal level of the plurality of metal levels only in the second socket region during patterning of the second conductive lines.

20. The method of claim 19, further comprising interconnecting the glue metal level to third conductive lines of the active memory array only in the third socket region during patterning of the third conductive lines.

21. The method of claim 17, further comprising interconnecting the M4 metal level to the highest metal level of the plurality of metal levels only in the first peripheral area during patterning of the M4 metal level.

22. The method of claim 17, further comprising;
forming a number of inactive arrays in the decoder area over the glue metal level and over the CMOS devices associated with an active memory array; and
forming a grid of conductive lines around each of the inactive arrays patterned in the glue metal level.

23. The method of claim 17, further comprising forming a number of inactive arrays in the second peripheral area over the glue metal level and over the CMOS devices associated with an active memory array.

24. A method of forming a memory device, comprising:
forming conductive material at respective levels over a substrate;
electrically coupling each respective level of conductive material to corresponding circuitry on the substrate during patterning of the respective level of conductive material so that each respective level of conductive material has a homogenized etch bias during patterning thereof; and
patterning each respective level of conductive material electrically coupled to corresponding circuitry on the substrate,
wherein electrically coupling conductive material from which conductive lines of an active memory array will be patterned through conductive material at a glue level G1 includes forming a grid of conductive lines in an area outside the socket region and an area of the active memory array from the conductive material at a glue level G1, the grid of conductive lines being formed around each of a number of inactive arrays.

25. The method of claim 24, wherein electrically coupling each respective level of conductive material to corresponding circuitry on the substrate includes electrically coupling a first conductive material from which conductive lines of an active memory array will be patterned through conductive material at a glue level G1.

26. The method of claim 25, further comprising forming an interconnection between the conductive material at a glue level G1 and a lower metal in an area outside a first socket region and an active memory array area.

27. The method of claim 25, wherein electrically coupling each respective level of conductive material to corresponding circuitry on the substrate includes:
electrically coupling a second conductive material from which conductive lines of an active memory array will be patterned to a lower metal level in a second socket region; and
electrically coupling a third conductive material from which conductive lines of an active memory array will be patterned to the lower metal level in a third socket region.

28. The method of claim 25, further comprising forming an interconnection between a metal level above conductive materials from which conductive lines of an active memory array are patterned in an area outside the socket region and an active memory array area that does not have inactive arrays formed therein.

29. The method of claim 24, further comprising forming an interconnection between the conductive material at a glue level G1 and a lower metal in an area outside a first socket region and an active memory array area.

30. The method of claim 24, wherein electrically coupling each respective level of conductive material to corresponding circuitry on the substrate includes:
electrically coupling a second conductive material from which conductive lines of an active memory array will be patterned to a lower metal level in a second socket region; and
electrically coupling a third conductive material from which conductive lines of an active memory array will be patterned to the lower metal level in a third socket region.

31. The method of claim 24, further comprising forming an interconnection between a metal level above conductive materials from which conductive lines of an active memory array are patterned in an area outside the socket region and an area of the active memory array that does not have inactive arrays formed therein.

* * * * *

UNITED STATES PATENT AND TRADEMARK OFFICE
CERTIFICATE OF CORRECTION

PATENT NO. : 8,785,314 B2
APPLICATION NO. : 13/463245
DATED : July 22, 2014
INVENTOR(S) : Fabio Pellizzer et al.

Page 1 of 1

It is certified that error appears in the above-identified patent and that said Letters Patent is hereby corrected as shown below:

In the Claims

In column 16, lines 50-51, in Claim 17, delete "metal levels metal levels" and insert -- metal levels --, therefor.

In column 16, lines 56-57, in Claim 17, delete "metal levels metal levels" and insert -- metal levels --, therefor.

In column 17, line 34, in Claim 22, delete "comprising;" and insert -- comprising: --, therefor.

Signed and Sealed this
Thirteenth Day of January, 2015

Michelle K. Lee
*Deputy Director of the United States Patent and Trademark Office*